United States Patent [19]

Schroeder et al.

[11] 4,163,907
[45] Aug. 7, 1979

[54] THREE LOGIC STATE INPUT BUFFERS

[75] Inventors: James E. Schroeder, Indialantic; Richard L. Goslin, Melbourne, both of Fla.

[73] Assignee: Harris Corporation, Melbourne, Fla.

[21] Appl. No.: 833,934

[22] Filed: Sep. 16, 1977

[51] Int. Cl.² .............. H03K 19/20; H03K 19/08; H03K 17/30; H03K 17/60

[52] U.S. Cl. .................. 307/209; 307/205; 307/251; 307/DIG. 1

[58] Field of Search .......... 307/205, 209, 214, 350, 307/360, DIG. 1; 365/230

[56] References Cited

U.S. PATENT DOCUMENTS

| 3,609,411 | 9/1971 | Ma et al. | 307/205 X |
| 3,845,328 | 10/1974 | Hollingsworth | 307/209 X |
| 3,851,189 | 11/1974 | Moyer | 307/360 X |
| 3,944,848 | 3/1976 | Heeren | 307/205 |
| 3,969,633 | 7/1976 | Paluck et al. | 307/209 X |
| 3,991,326 | 11/1976 | Kawagoe et al. | 307/205 X |

FOREIGN PATENT DOCUMENTS 2657948 7/1977 Fed. Rep. of Germany .......... 307/209

Primary Examiner—Larry N. Anagnos
Attorney, Agent, or Firm—Leitner, Palan, Martin & Bernstein

[57] ABSTRACT

A buffer having a single input and a pair of outputs providing three unambiguous logic output states including a first output connected directly to the input and a second output connected to the junction of a common gate configured FET and an impedance. The input is also connected to the source and body of the FET and a voltage source is connected to the impedance. The first output varies with the input for a first polarity input signal and the second output varies with the input for the opposite polarity input signal.

19 Claims, 6 Drawing Figures

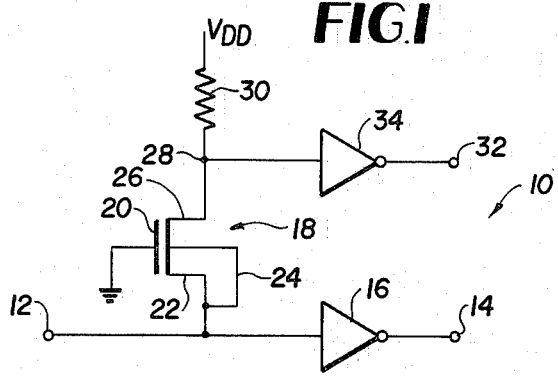
FIG.1
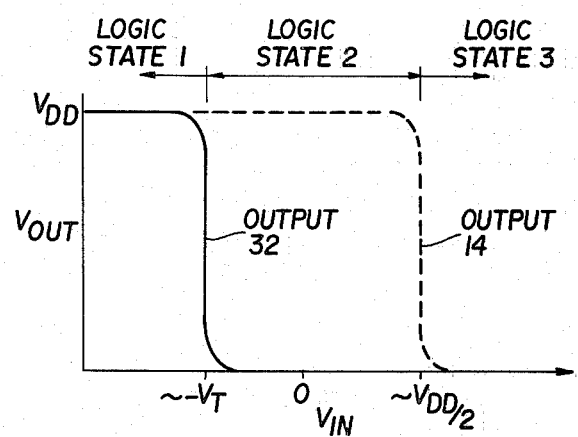
FIG.2
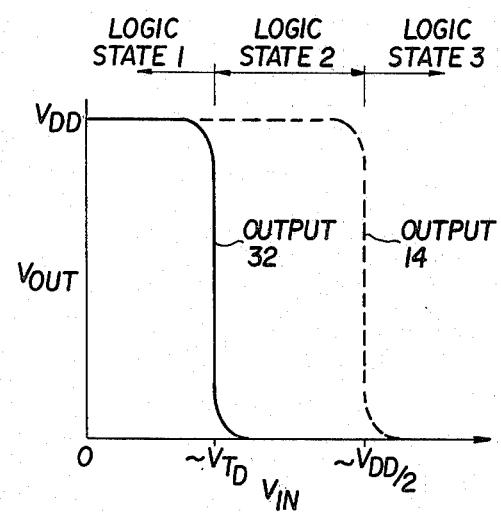
FIG.5
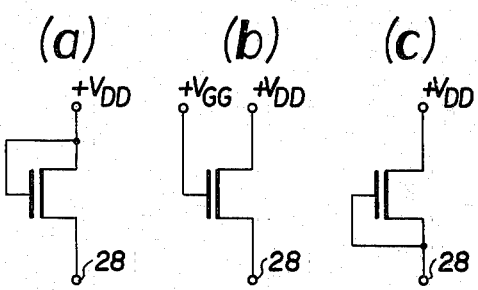
FIG.4
FIG.3
| LOGIC STATE | INPUT | OUTPUT 32 | OUTPUT 14 |
|---|---|---|---|
| 1 | LESS THAN $\approx -V_T$ | 1 | 1 |
| 2 | $\approx -V_T$ TO $\approx V_{DD}/2$ | 0 | 1 |
| 3 | GREATER THAN $\approx V_{DD}/2$ | 0 | 0 |
FIG.6
| LOGIC STATE | INPUT | OUTPUT 32 | OUTPUT 14 |
|---|---|---|---|
| 1 | LESS THAN $\approx V_{T_D}$ | 1 | 1 |
| 2 | $\approx V_{T_D}$ TO $\approx V_{DD}/2$ | 0 | 1 |
| 3 | GREATER THAN $\approx V_{DD}/2$ | 0 | 0 |

THREE LOGIC STATE INPUT BUFFERS

BACKGROUND OF THE INVENTION

The present invention relates generally to input buffers and more particularly to an input buffer capable of providing three unambiguous logic output states.

It is frequently necessary for one input of an integrated circuit to have the capability of forcing the circuit to more than two logic states. In CMOS PROM, for example, the address inputs are used as conventional addresses (namely, ones and zeros) and also to enable the circuitry for testing and decoding. To provide the multilevel logic states in bipolar PROMS, zener diodes are used in the input buffers. The use of zener diodes in FET integrated circuits has been found not to be advantageous since the control of the zener breakdown voltages would add extra processing complexity to the FET process. Also, with the use of zener diodes, the input voltages applied are limited to one polarity and, for normal operation, cannot exceed the zener breakdown voltage. In practice, this would limit the input swing on an FET circuit to about zero to seven volts.

Thus there exists a need for a buffer having a single input capable of handling positive and negative polarity input signals to provide at least three unambiguous logic output states and which is capable of handling reference voltage sources from four to eleven volts in normal operation.

SUMMARY OF THE INVENTION

The present invention is an input buffer having a single input and two outputs which in combination are capable of providing three unambiguous logic output states. Positive and negative input signals at a single input terminal are provided at a first output which may include an FET inverter to provide FET compatible logic output signals in response to the input signals of a first polarity. The second output circuit may include an enhancement mode FET in a common gate configuration wherein the gate is connected to a fixed potential, the drain is connected to the second output and the source and body are connected to the input terminal. An impedance, for example, a resistor, is connected between a reference or supply voltage and the second output. The FET and impedance are ratioed so as to be capable of providing a logic output signal at the second output for a range of supply voltages from four to eleven volts. A second FET inverter is provided at the second output so as to provide FET compatible logic levels in response to opposite polarity input signals. If a depletion mode FET is used in a common gate configuration, the first and second outputs would be responsive to single polarity input signal to provide the three output states. Whereas the first output provides normal addressing through the address buffers, the second output signal provides an addressing input to the decoders. Thus dual function or three state logic states are provided from a single input using FET compatible circuitry.

OBJECTS OF THE INVENTION

An object of the present invention is to provide a three logic state buffer having a single input.

A further object of the invention is to provide a three logic state buffer using FET compatible circuitry.

An even further object of the present invention is to provide a logic buffer which provides three unambiguous logic output states in response to a single input signal of positive and negative polarities.

A still further object of the present invention is to provide an FET compatible input buffer capable of three logic states operable in a wide range of supply voltages.

These and other objects, advantages and novel features of the present invention will become apparent from the following detailed description of the invention when considered in conjunction with the accompanying drawings.

BRIEF DESCRIPTION OF THE DRAWINGS

FIG. 1 is a preferred embodiment of the three logic state input buffer incorporating the principles of the present invention using an N-channel enhancement mode device.

FIG. 2 is a diagram of the transfer characteristics for the circuit of FIG. 1.

FIG. 3 is a truth table of the logic states for the circuit of FIG. 1.

FIGS. 4a, b, c, are alternative loads for use in lieu of the impedance in the circuit of FIG. 1.

FIG. 5 is a diagram of the transfer characteristics for a depletion mode FET in the circuit of FIG. 1.

FIG. 6 is a truth table of logic states for a depletion mode FET in the circuit of FIG. 1.

DESCRIPTION OF THE PREFERRED EMBODIMENTS

FIG. 1 illustrates a FET compatible, three logic state buffer 10 having an input terminal 12 and a first output terminal 14 connected through an inverter 16. The inverter 16 may be a CMOS inverter which provides FET compatible logic level output signals. Also connected to the input 12 is an FET 18 in a common gate configuration. The FET 18 may be an N channel MOS device having its gate 20 grounded, its source 22 and body 24 connected directly to the input 12 and its drain 26 connected to a junction or node 28. Also connected to the node 28 is an impedance 30 represented as a resistor which is also connected to a supply voltage $+V_{DD}$. The second output 32 and node 28 are connected by an inverter 34. As with inverter 16, inverter 34 may be a CMOS inverter which provides FET compatible logic level output signals.

In the normal operation of the input buffer of FIG. 1, when the input is positive, it drives the inverter stage 16 to provide normal logic levels at output 14. As illustrated in FIG. 2, the output signal at output 14 remains at $V_{DD}$ or a logic high until the input signal exceeds approximately $V_{DD}/2$ at which point output 14 becomes zero or ground or a logic low. The FET 18 which may be, for example, an enhancement mode N channel device, is off for positive signals because the gate to source voltage is less than the threshold voltage $V_T$. Thus node 28 is pulled to $+V_{DD}$ by resistor 30 and inverter 34 provides a low logic level at output 32 as illustrated in FIG. 2.

The ratio of the impedance of N channel FET 18 and resistor 30 is chosen so than when the input terminal 12 is pulled negative or approximately two volts below the threshold voltage of FET 18, FET 18 will conduct and the voltage at terminal 28 will be a logic low. This low logic level which is approximately equal to or less than ground is inverted by inverter 34 and provides a high output on output terminal 32. For negative input voltages, the output terminal 14 is held at $V_{DD}$ or a logic high as illustrated in FIG. 2.

Thus when the input signal 12 is positive, the normal addressing output 14 will vary between high and low logic states to effectuate a normal address function and output 32 is clamped to a logic low. When the input signal at terminal 12 is pulled sufficiently negative, FET 18 conducts causing the output 32 to be a logic high for addressing the testing circuit and output 14 is clamped to a logic high. Thus the input buffer 10 has a single input at 12 to provide the normal addressing level logics at output 14 for one polarity of input signals and an independent logic signal at output 32 for the opposite polarity input signal. The three logic states produced by the combination of logic states at outputs 14 and 32 is summarized in the table of FIG. 3.

With the common gate configured, enhancement mode, N channel FET 18, loads other than resistor 30 may be used. Illustrated in FIG. 4 are (a) N channel saturated load; (b) N channel triode load ($V_{GG} > V_{DD}$); and (c) N channel depletion mode load. These three loads are but examples of standard MOS loads which also include other enhancement or depletion P or N channel FETs in either the triode or saturated regions of operation. The use of resistor 30 or the MOS loads of FIG. 4 and a common gate configured FET 18 provides a circuit implemented with normal FET IC processing.

If N channel device 18 was a depletion mode device, the circuit of FIG. 1 would provide three logic states for input signals of a single polarity. As illustrated in FIG. 5 and summarized in the truth table of FIG. 6, outputs 14 and 32 are both logic high for an input voltage less than approximately the threshold voltage $V_{TD}$ of device 18; output 14 is logic high and output 32 logic low for input voltages between approximately $V_{TD}$ and approximately $V_{DD/2}$; and both outputs 14 and 32 are logic low for an input voltage greated than approximately $V_{DD/2}$.

The circuit of FIG. 1 could be implemented with P channel devices with the reversal of the polarities of all voltages (i.e., $V_{DD}$ would be negative). For enhancement mode P channel device, the switching of output 32 occurs at approximately $+V_T$ and of output 14 occurs at approximately $-V_{DD/2}$. For depletion mode, P channel devices the circuit is responsive to only negative input signals switching at approximately $-V_{TD}$ and $-V_{DD/2}$.

The use of an FET in a common gate configuration wherein the gate is grounded or connected to a fixed potential and the input signal is applied to the body and the source is the essence of the circuit. This allows the input signal to be pulled negative and it allows the circuit to operate as described above. By placing an impedance between node 28 and a positive reference source potential $+V_{DD}$, a high voltage is placed at the node 28 when the FET 18 is not conducting. It is this unique combination of both these elements that makes the present invention advantageous over the prior art.

Thus it can be seen that the objects of the invention are obtained wherein an input buffer, having a single input, provides three distinct unambiguous output logic levels. Although the invention has been illustrated and described in detail, it is clear that the same is by way of illustration and example only and is not to be taken by way of limitation. The spirit and scope of the claims are limited only by the terms of the appended claims.

What is claimed:

1. A three logic state buffer comprising:
    input means for receiving positive and negative polarity input signals;
    first output means for providing two logic level output signals for one polarity of said input signals;
    semiconductor switch means connected to said input means;
    impedance means connected between a voltage source and said switch means; and
    second output means connected to the junction of said switch means and said impedance means for providing two logic level output signals for a polarity of said input signals opposite said one polarity.

2. The three logic state buffer according to claim 1 wherein said switch means presents an electrical impedance to said input signal, said switch means and impedance means are ratioed so that said second output means is capable of operating with a voltage source variation of four to eleven volts.

3. The three logic state buffer according to claim 1 wherein said switching means includes an enhancement mode field effect transistor in a common gate configuration.

4. The three logic state buffer according to claim 3 wherein said input means applies said input signals to the source and body of said field effect transistor and said gate is connected to a fixed potential.

5. The three logic state buffer according to claim 4 wherein said field effect transistor is an N channel insulated gate field effect transistor and said voltage source is of positive polarity.

6. The three logic state buffer according to claim 3 wherein said impedance means includes a resistor.

7. The three state buffer according to claim 1 wherein said input means is a single input terminal.

8. The three state buffer according to claim 1 wherein said first output means is responsive to positive polarity input signals and said second output means is responsive to negative polarity input signals.

9. The three state buffer according to claim 8 wherein said first and second output means provide a fixed logic level output signal for negative and positive input signals, respectively.

10. A logic buffer comprising:
    a voltage source terminal;
    a signal input terminal;
    a first output means connected directly to said input terminal;
    a second output means;
    an impedance connected between said voltage source terminal and said second output means; and
    a field effect transistor having a gate connected to a fixed potential, a drain connected to said second output means and a source and body connected to said signal input terminal whereby positive and negative input signals at said signal input terminal results in distinct level signals being produced by said first and second output means.

11. The logic buffer according to claim 10 wherein said field effect transistor is an enhancement mode device whereby said first output terminal assumes two logic states for input signals of one polarity and said second output assumes two logic states for input signals of opposite polarity.

12. The logic buffer according to claim 10 wherein said field effect transistor is a depletion mode device whereby said first and second outputs each assume two logic states at different values of input signals of one polarity.

13. The logic buffer according to claim 10 wherein said impedance is a resistor.

14. The logic buffer according to claim 10 wherein said impedance is a field effect transistor.

15. The logic buffer according to claim 10 wherein said voltage source may be in the range of four to eleven volts.

16. A three logic state input buffer for FET logic comprising:
   input means for receiving positive and negative input signals;
   first output means connected to said input means for providing two FET compatible logic state signals in response to said input signals of a first polarity; and
   second output means connected to said input means for providing two FET compatible logic state signals in response to an input signal of a polarity opposite said first polarity said second output means including a common gate configuration FET connected to said input means and an impedance connected to said FET and a positive reference voltage.

17. The buffer according to claim 16 wherein said first output means provides said logic signals in response to positive input signals and said second output means provides said logic signals in response to negative input signals.

18. The buffer according to claim 16 wherein said input means is connected to the body and source of said FET and the impedance of said FET and said impedance are ratioed so as to be capable of operating with a reference voltage in the range of four to eleven volts.

19. The buffer according to claim 16 wherein said first output means provides a fixed logic state signal in response to input signals of said opposite polarity and said second output means provides a fixed logic state signal in response to input signals of said first polarity.

* * * * *

UNITED STATES PATENT AND TRADEMARK OFFICE
CERTIFICATE OF CORRECTION

PATENT NO. : 4,163,907
DATED : August 7, 1979
INVENTOR(S) : Schroeder, et al.

It is certified that error appears in the above-identified patent and that said Letters Patent are hereby corrected as shown below:

Column 2, line 36, delete "an" and insert therefor -a-

Column 2, line 62, delete "than" and insert therefor -that-

Column 3, line 37, delete "greated" and insert therefor -greater-

Column 3, line 48, delete "an" and insert therefor --a-

Column 4, line 58, insert -logic- between the words "distinct" "level"

Signed and Sealed this

Thirteenth Day of November 1979

[SEAL]

Attest:

RUTH C. MASON
Attesting Officer

LUTRELLE F. PARKER
Acting Commissioner of Patents and Trademarks